(12) United States Patent
Uchida

(10) Patent No.: US 9,123,710 B2
(45) Date of Patent: Sep. 1, 2015

(54) SEMICONDUCTOR DEVICE HAVING A SEMICONDUCTOR CHIP AND WIRING

(71) Applicant: Sumitomo Electric Industries, Ltd., Osaka-shi (JP)

(72) Inventor: Kosuke Uchida, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 13/865,721

(22) Filed: Apr. 18, 2013

(65) Prior Publication Data

US 2013/0307131 A1 Nov. 21, 2013

Related U.S. Application Data

(60) Provisional application No. 61/648,210, filed on May 17, 2012.

(30) Foreign Application Priority Data

May 17, 2012 (JP) .................................. 2012-112989

(51) Int. Cl.
*H01L 23/495* (2006.01)
*H01L 23/02* (2006.01)
(Continued)

(52) U.S. Cl.
CPC ...... *H01L 23/4952* (2013.01); *H01L 23/49541* (2013.01); *H01L 23/49562* (2013.01); *H01L 23/49575* (2013.01); *H01L 2224/45147* (2013.01); *H01L 2224/48247* (2013.01); *H01L 2224/49175* (2013.01);
(Continued)

(58) Field of Classification Search
CPC ........... H01L 2224/48091; H01L 2224/48247;
H01L 2924/01078; H01L 2924/14; H01L 2924/15311; H01L 2924/3011; H01L 2924/01013; H01L 23/49562; H01L 23/50; H01L 2924/01079
USPC ......... 257/676, 672, 674, 685, 691–693, 723, 257/784, 786
See application file for complete search history.

(56) References Cited

U.S. PATENT DOCUMENTS 6,559,525 B2 * 5/2003 Huang ........................... 257/675
7,105,932 B2 * 9/2006 Kodani et al. ................. 257/784
(Continued)

FOREIGN PATENT DOCUMENTS

JP 2011205020 * 10/2011

OTHER PUBLICATIONS

Takasusuki, Kazuhiro, "Causes of Failures and Techniques for Improving and Evaluating Reliability of Wire Bonding Focused on Cu Wires," Technical Information Institute Co., Ltd., Jul. 29, 2011, pp. 163, 263.

*Primary Examiner* — A. Sefer
*Assistant Examiner* — Dilinh Nguyen
(74) *Attorney, Agent, or Firm* — Venable LLP; Michael A. Sartori; F. Brock Riggs

(57) ABSTRACT

A semiconductor device includes at least one semiconductor chip, a first lead, and a second lead. The first lead includes a first portion connected to the semiconductor chip via a first wiring. The second lead includes a first portion connected to the semiconductor chip via a second wiring. The first portion of the first lead and the first portion of the second lead extend along a first direction. The first portion of the first lead is disposed so as to oppose the first portion of the second lead. The semiconductor chip is disposed between the first portion of the first lead and the first portion of the second lead.

6 Claims, 3 Drawing Sheets

(51) Int. Cl.
*H01L 23/52* (2006.01)
*H01L 23/34* (2006.01)
*H01L 23/48* (2006.01)
*H01L 29/40* (2006.01)

(52) U.S. Cl.
CPC ............... *H01L 2924/01015* (2013.01); *H01L 2924/1305* (2013.01); *H01L 2924/13055* (2013.01); *H01L 2924/13091* (2013.01)

(56) References Cited

U.S. PATENT DOCUMENTS

| | | | |
|---|---|---|---|
| 7,245,007 B1 * | 7/2007 | Foster | 257/678 |
| 2007/0132112 A1 * | 6/2007 | Ozaki et al. | 257/787 |
| 2012/0248539 A1 * | 10/2012 | Zhang et al. | 257/368 |

\* cited by examiner

SEMICONDUCTOR DEVICE HAVING A SEMICONDUCTOR CHIP AND WIRING

CROSS-REFERENCE RELATED APPLICATIONS

This application claims priority to Provisional Application Ser. No. 61/648210, filed on May 17, 2012 and claims the benefit of Japanese Patent Application No. 2012-112989, filed on May 17, 2012, all of which are incorporated herein by reference in their entirety.

BACKGROUND

1. Field

The present invention relates to a semiconductor device.

2. Related Background

As examples of semiconductor devices, a case-type semiconductor device and a resin-seal type semiconductor device have been known (see, for example, *Causes of Failures and Techniques for Improving and Evaluating Reliability of Wire Bonding Focused on Cu Wires*, Technical Information Institute Co., Ltd., Jul. 29, 2011, p. 163 and p. 263). In a resin-seal type semiconductor device, a semiconductor chip mounted on a die pad is connected to a plurality of leads via corresponding wires.

SUMMARY

However, in the semiconductor device, the wires are disposed relatively close to one another. Therefore, a probability that the wires contact with one another is not sufficiently reduced.

It is therefore an object of the present invention to provide a semiconductor device in which wirings that connect a semiconductor chip to leads hardly contact with one another.

A semiconductor device according to an aspect of the present invention includes at least one semiconductor chip, a first lead including a first portion connected to the at least one semiconductor chip via a first wiring, and a second lead including a first portion connected to the at least one semiconductor chip via a second wiring, the first portion of the first lead and the first portion of the second lead extend along a first direction, the first portion of the first lead is disposed so as to oppose the first portion of the second lead, and the at least one semiconductor chip is disposed between the first portion of the first lead and the first portion of the second lead.

In the semiconductor device, the first wiring and the second wiring may be separated from each other, and thus, the first wiring and the second wiring hardly contact with each other.

The above-described semiconductor device may further include a die pad having a chip mount surface for mounting the at least one semiconductor chip, and an insulating member disposed between the die pad and the first lead. In this case, the first lead is insulated from the die pad by the insulating member.

The at least one semiconductor chip include a plurality of semiconductor chips, and the plurality of semiconductor chips may be arranged along the first direction. In this case, even when an increased number of the semiconductor chips are disposed, wirings between the semiconductor chips and leads do not intersect with one another.

The first wiring and the second wiring may extend along a second direction intersecting with the first direction. In this case, the first wiring and the second wiring are separated from each other with a largest distance therebetween.

A material of the at least one semiconductor chip may include wide-bandgap semiconductor. In this case, a larger current is allowed to flow through the first wiring and the second wiring, as compared to a semiconductor chip made of silicon.

The first lead may have an L shape. In this case, a direction in which the first lead extends may be adjusted.

As mentioned above, a semiconductor device in which wirings that connect a semiconductor chip to leads hardly contact with one another may be provided.

DETAILED DESCRIPTION

Figure 1:
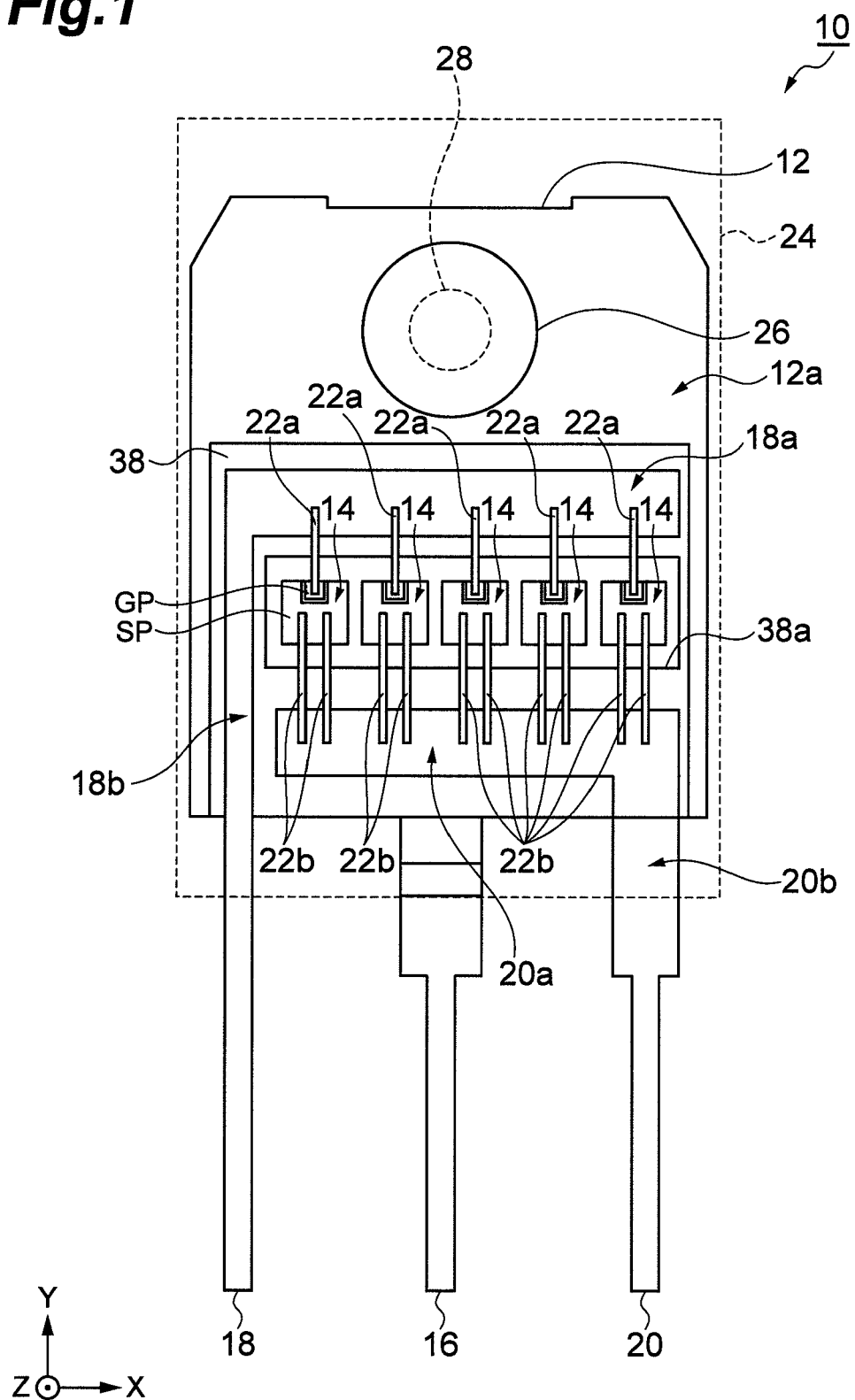
FIG. 1 is a plan view schematically illustrating a semiconductor device according to a first embodiment.

Embodiments of the present invention will be hereinafter described in detail with reference to the accompanying drawings. Note that, in the drawings, same or similar elements are designated by a same reference numeral, and a description thereof will be omitted.

First Embodiment

FIG. 1 is a plan view schematically illustrating a semiconductor device according to a first embodiment. In FIG. 1, an XYZ orthogonal coordinate system is shown. A semiconductor device 10 illustrated in FIG. 1 is a resin-seal type semiconductor device. The semiconductor device 10 includes a plurality of semiconductor chips 14, a first lead 18, and a second lead 20.

The semiconductor device 10 may include a die pad 12 having a chip mount surface 12a for mounting the semiconductor chips 14. The die pad 12 may be electrically connected to the semiconductor chips 14. The die pad 12 has, for example, a plate-like shape. The chip mount surface 12a has, for example, a rectangular shape. Examples of a material of the die pad 12 include a metal such as copper (Cu), copper alloy, and the like. In the die pad 12, a through hole 26 may be formed so as to pass through the die pad 12 in a plate thickness direction. When the semiconductor device 10 is fixed to another member (such as, for example, a heatsink, and the like), for example, via a screw, the screw is passed through the through hole 26.

The semiconductor device 10 may include a third lead 16. The leads 16, 18, and 20 extend along a Y direction, and arranged along an X direction. The lead 16 is located between the leads 18 and 20. The leads 16, 18, and 20 and the die pad 12 may form a lead frame. The semiconductor device 10 is a power semiconductor device used, for example, for a power source and the like. Examples of package of the semiconductor device 10 are common TO series. Examples of the TO series include TO-247, TO-220, TO-263 (D2-PAK), and TO-252 (D-PAK).

The lead 18 includes a first portion 18a connected to each of the semiconductor chips 14 via a wiring 22a (first wiring). The lead 18 may include a second portion 18b connected to the first portion 18a. The first portion 18a extends along the X direction (a first direction). The second portion 18b extends along the Y direction (a second direction intersecting with the first direction). The lead 18 has, for example, an L shape.

The lead 20 includes a first portion 20a connected to each of the semiconductor chips 14 via a plurality of wirings 22b (second wirings). Each of the semiconductor chips 14 may be connected to the first portion 20a via a single wiring 22b. The lead 20 may include a second portion 20b connected to the first portion 20a. The first portion 20a extends along the X direction. The second portion 20b extends along the Y direction. The lead 20 has, for example, an L shape.

The first portion 18a of the lead 18 is disposed so as to oppose the first portion 20a of the lead 20. The semiconductor chips 14 are disposed between the first portion 18a of the lead 18 and the first portion 20a of the lead 20. The semiconductor chips 14 may be arranged along the X direction. The second portion 18b of the lead 18 may be disposed so as to oppose the second portion 20b of the lead 20. The wirings 22a and 22b may be formed so as to extend along the Y direction.

The semiconductor chips 14 are mounted in predetermined positions on the chip mount surface 12a. Examples of the semiconductor chips 14 include transistors such as MOS-FETs, insulated gate bipolar transistors (IGBTs), and the like. The semiconductor chips 14 may be mounted on the chip mount surface 12a with an adhesion layer made of a material containing a lead-containing metal solder, a lead-free metal solder, a conductive resin, or the like. interposed therebetween. Examples of the material of the semiconductor chips 14 include semiconductor such as wide-bandgap semiconductor, silicon, and other semiconductors. The wide-bandgap semiconductor includes a bandgap larger than a bandgap of silicon. Examples of the wide-bandgap semiconductor include silicon carbide (SiC), gallium nitride (GaN), and diamond.

Each of the semiconductor chips 14 may include electrode pads GP and SP. The electrode pad GP is connected to the lead 18 via the wiring 22a. The electrode pad SP is connected to the lead 20 via the wirings 22b. When the semiconductor chips 14 include MOS-FETs, the electrode pad GP corresponds to a gate electrode pad, the electrode pad SP corresponds to a source electrode pad. When the semiconductor chips 14 include IGBTs, the electrode pad GP corresponds to a gate electrode pad, and the electrode pad SP corresponds to an emitter electrode pad. For example, still another electrode pad such as a drain electrode pad, a collector electrode pad, or the like may be formed over an entire back surface of each of the semiconductor chips 14.

The semiconductor device 10 may include an insulating member 38 disposed between the die pad 12 and the leads 18 and 20. The insulating member 38 is provided between the die pad 12 and the first portion 18a of the lead 18 and between the die pad 12 and the first portion 20a of the lead 20 in a Z direction (a third direction intersecting with the first direction and the second direction). The insulating member 38 is, for example, an insulating substrate or an insulating layer. Examples of a material of the insulating member 38 include a resin such as epoxy resin and the like or a ceramics. The die pad 12, the insulating member 38, and the leads 18 and 20 may be connected together via an adhesive. An opening 38a is formed in the insulating member 38. In the opening 38a, the semiconductor chips 14 are disposed.

An inner end portion of the lead 16 is mechanically connected to the die pad 12 in an integral fashion. The die pad 12 is conductive, and thus, the lead 16 and the die pad 12 are electrically connected to each other. Examples of a material of the lead 16 include same materials as materials that may be used for the die pad 12.

When the semiconductor chips 14 include MOS-FETs, the lead 16 corresponds to a drain electrode terminal, the lead 18 corresponds to a gate electrode terminal, and the lead 20 corresponds to a source electrode terminal. When the semiconductor chips 14 include IGBTs, the lead 16 corresponds to a collector electrode terminal, the lead 18 corresponds to a gate electrode terminal, and the lead 20 corresponds to an emitter electrode terminal. Examples of a material of the leads 18 and 20 include a metal such as copper, copper alloy, and the like. The wirings 22a and 22b may be wires or bonding ribbons. Examples of a material of the wirings 22a and 22b include a metal such as aluminium, gold, copper, and the like. The wirings 22a and 22b are connected to the leads 18 and 20, and the semiconductor chips 14 by wire bonding using, for example, an ultrasonic wave, pressurization, or the like.

The die pad 12, the semiconductor chips 14, the first portion 18a of the lead 18, and the first portion 20a of the lead 20 may be covered by a resin portion 24. An inner end portion of each of the leads 16, 18, and 20 is inserted in the resin portion 24. A part of each of the leads 16, 18, and 20 inserted in the inside of the resin portion 24 is a so-called inner lead portion. A portion of each of the leads 16, 18, and 20 disposed outside the resin portion 24 is an outer lead portion. An example outer shape of the resin portion 24 is an approximately rectangular parallelepiped shape. Examples of a material of the resin portion 24 include a thermoplastic resin such as polyphenylene sulfide resin (PPS resin), liquid crystal polymer, and the like. The resin portion 24 may be formed by molding the die pad 12 and the semiconductor chips 14 with the thermoplastic resin. A through hole 28 is formed in the resin portion 24 so that a central axis line of the through hole 26 of the die pad 12 is a central axis line of the through hole 28. Similar to the through hole 26, when fixing using a screw is performed, the screw is passed through the through hole 28. The through hole 28 has a diameter smaller than a diameter of the through hole 26.

In the semiconductor device 10, the wirings 22a and the wirings 22b may be separated from each other, and thus, the wirings 22a and the wirings 22b hardly contact with each other. Since a distance between the first portion 18a of the lead 18 and the semiconductor chips 14 may be small, a length of the wirings 22a may be small. Since a distance between the first portion 20a of the lead 20 and each of the semiconductor chips 14 may be small, a length of the wirings 22b may be small. With the wirings 22a and the wirings 22b having a reduced length, even when a large current flows in the wirings 22a and 22b, the wirings 22a and 22b are hardly cut. Thus, even when a small number of the wirings 22a and 22b are disposed, a large current is allowed to flow through the wirings 22a and 22b, and therefore, fabrication costs may be reduced. Furthermore, when the length of the first portion 18a of the lead 18 is increased, the wirings 22a are hardly disposed at high density in the first portion 18a of the lead 18 even with an increased number of wirings 22a being disposed. When the length of the first portion 20a of the lead 20 is increased, the wirings 22b are hardly disposed at high density in the first portion 20a of the lead 20 even with an increased number of wirings 22b being disposed. Thus, a probability that the wirings 22a and 22b contact with each other is reduced. A larger current is allowed to flow through the wirings 22a and 22b by providing an increased number of the wirings 22a and 22b. Furthermore, reduction in yield of the semiconductor device 10 due to an error and an adhesion failure which occur in bonding may be reduced.

When the material of the semiconductor chips 14 includes a wide-bandgap semiconductor, a larger current is allowed to flow through the wirings 22a and 22b, as compared to the semiconductor chips 14 made of silicon. Thus, advantages resulting from preventing contact of wirings with each other and reducing the length of wirings are prominent.

When the semiconductor device 10 includes the insulating member 38, the leads 18 and 20 are insulated from the die pad 12 by the insulating member 38 the insulating member 38.

The leads 18 and 20 may be supported by the die pad 12 via the insulating member 38. As a result, a structure of the semiconductor device 10 is stabilized.

Normally, a plurality of semiconductor chips is connected to a lead for a gate and a lead for a source via a wire. In this case, a wiring disposed between a single semiconductor chip and the lead for a source might intersect with a wiring disposed between another semiconductor chip and the lead for a gate. On the other hand, in the semiconductor device 10 in which the plurality of semiconductor chips 14 is arranged along the X direction, the wirings 22a and 22b disposed respectively between the semiconductor chips 14 and the lead 18 and between the semiconductor chips 14 and the lead 20 are not intersect with each other even when an increased number of semiconductor chips 14 are disposed.

When the wirings 22a and 22b extend along the Y direction, the wirings 22a and the wirings 22b are separated from each other with a largest distance therebetween. As a result, a probability that the wirings 22a and the wirings 22b contact each other may be further reduced. The lengths of the wirings 22a and 22b may be minimized.

When each of the leads 18 and 20 has an L shape, the direction in which each of the leads 18 and 20 extends may be adjusted. As a result, the outer lead portion of each of the leads 18 and 20 may protrude in the Y direction. Also, even when an increased number of semiconductor chips 14 are disposed, a dimension of the semiconductor device 10 in the Y direction may be reduced.

Second Embodiment

Figure 2:
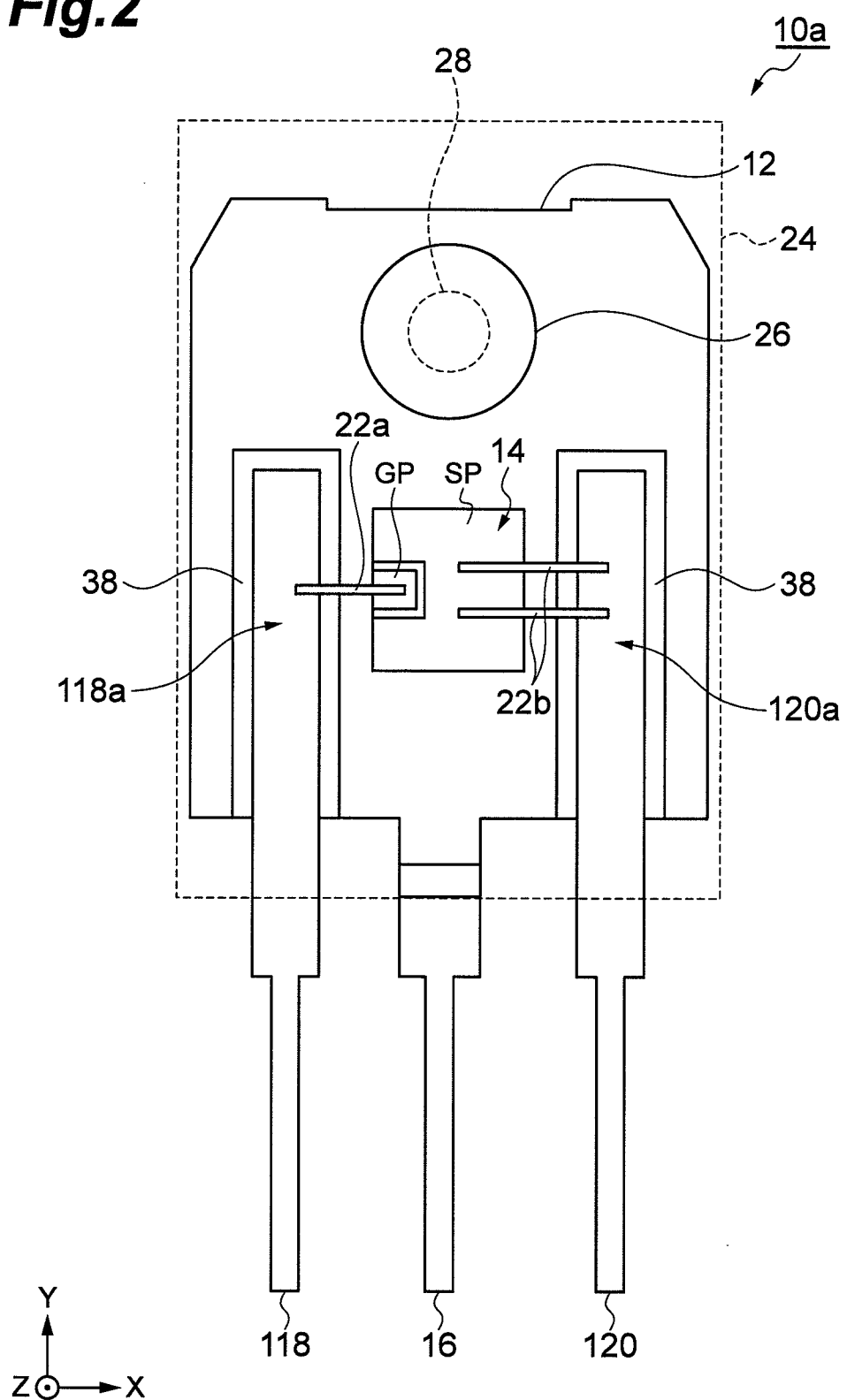
FIG. 2 is a plan view schematically illustrating a semiconductor device according to a second embodiment.

FIG. 2 is a plan view schematically illustrating a semiconductor device according to a second embodiment. A semiconductor device 10a illustrated in FIG. 2 has a similar structure to a structure of the semiconductor device 10, except that the semiconductor device 10a includes leads 118 and 120, instead of the leads 18 and 20, and includes a single semiconductor chip 14.

The lead 118 extends along a Y direction. The lead 118 includes a first portion 118a connected to the semiconductor chip 14 via a wiring 22a. The first portion 118a extends along the Y direction (a first direction).

The lead 120 extends along the Y direction. The lead 120 includes a first portion 120a connected to the semiconductor chip 14 via a plurality of wirings 22b. The first portion 120a extends along the Y direction.

The first portion 118a of the lead 118 is disposed so as to oppose the first portion 120a of the lead 120. The semiconductor chip 14 is disposed between the first portion 118a of the lead 118 and the first portion 120a of the lead 120. A plurality of semiconductor chips 14 may be arranged along the Y direction. The wirings 22a and 22b may extend along an X direction.

Similar advantages to those of the semiconductor device 10 may be achieved by the semiconductor device 10a.

Third Embodiment

Figure 3:
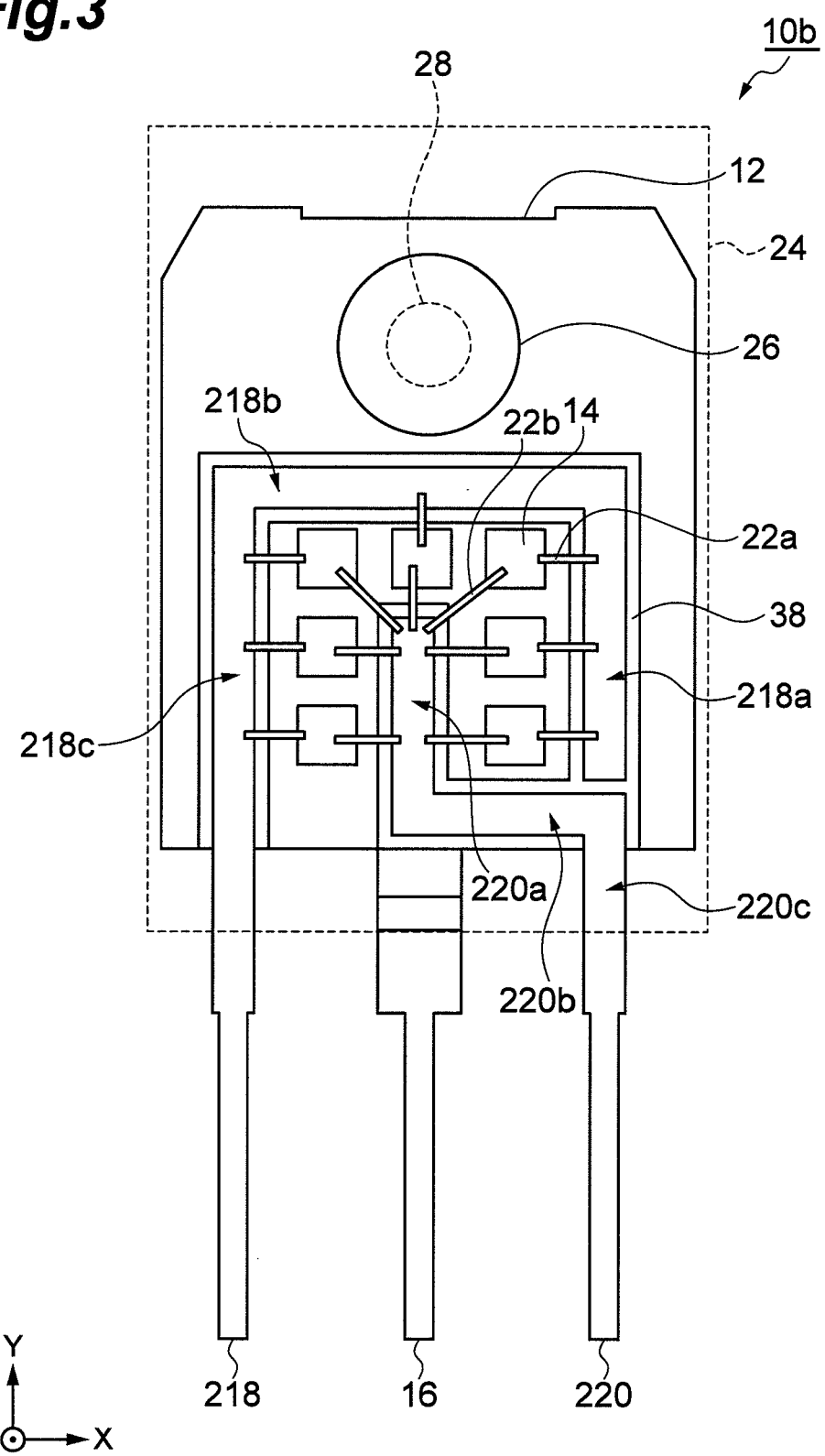
FIG. 3 is a plan view schematically illustrating a semiconductor device according to a third embodiment.

FIG. 3 is a plan view schematically illustrating a semiconductor device according to a third embodiment. A semiconductor device 10b illustrated in FIG. 3 has a similar structure to the structure of the semiconductor device 10, except that the semiconductor device 10b includes leads 218 and 220, instead of the leads 18 and 20.

The lead 218 includes a first portion 218a connected to semiconductor chips 14 via wirings 22a. The first portion 218a extends along a Y direction (a first direction). A second portion 218b extending along an X direction (a second direction intersecting with the first direction) is connected to the first portion 218a. A third portion 218c extending along the Y direction is connected to the second portion 218b.

The lead 220 includes a first portion 220a connected to the semiconductor chips 14 via a plurality of wirings 22b. The first portion 220a extends along the Y direction. A second portion 220b extending along the X direction is connected to the first portion 220a. A third portion 220c extending along the Y direction is connected to the second portion 220b.

The first portion 218a of the lead 218 is disposed so as to oppose the first portion 220a of the lead 220. The first portion 220a of the lead 220 is disposed so as to oppose the third portion 218c of the lead 218. The second portion 218b of the lead 218 is disposed so as to oppose the second portion 220b of the lead 220. The third portion 218c of the lead 218 is disposed so as to oppose the third portion 220c. The first portion 220a of the lead 220 is surrounded by the first to third portions 218a to 218c of the lead 218.

The semiconductor chips 14 are disposed between the first portion 218a of the lead 218 and the first portion 220a of the lead 220, between the third portion 218c of the lead 218 and the first portion 220a of the lead 220, and between the first portion 218a of the lead 218 and the third portion 218c of the lead 218. The plurality of semiconductor chips 14 may be arranged along a direction in which the lead 218 extends.

Similar advantages to those of the semiconductor device 10 may be achieved by the semiconductor device 10b. In the semiconductor device 10b, a large number of semiconductor chips 14 may be disposed in a small area.

Embodiments of the present invention have been described in detail. However, the present invention is not limited to the above-described embodiments.

For example, each of the semiconductor devices 10, 10a, and 10b may include a single semiconductor chip 14 or a plurality of semiconductor chips 14, a single wiring 22a or a plurality of wirings 22a, and a signal wiring 22b or a plurality of wirings 22b.

The semiconductor chip 14 may include a lateral transistor, instead of a vertical transistor. In this case, an electrode pad is not formed on a back surface of the semiconductor chip 14, but still another electrode pad such as, for example, a drain electrode pad, a collector electrode pad, or the like, is formed on a surface of the semiconductor chip 14. Thus, each of the semiconductor devices 10, 10a, and 10b does not have to include the die pad 12. The semiconductor chip 14 is connected to the lead 16 via a wiring.

What is claimed is:

1. A semiconductor device comprising:
at least one semiconductor chip;
a first lead including a first portion connected to the at least one semiconductor chip via a first wiring;
a second lead including a first portion connected to the at least one semiconductor chip via a second wiring;
a die pad having a chip mount surface for mounting the at least one semiconductor chip; and
an insulating member disposed between the die pad and the first lead, the first portion of the first lead being disposed on the die pad via the insulating member,
wherein each of the first portion of the first lead and the first portion of the second lead extends along a first direction, from one end to another end of a side of the at least one semiconductor chip, the side extending along the first direction,
the first portion of the first lead is disposed so as to oppose the first portion of the second lead,
the at least one semiconductor chip is disposed between the first portion of the first lead and the first portion of the second lead, and
the chip mount surface has a portion which is not covered by the insulating member.

2. The semiconductor device according to claim 1, wherein the at least one semiconductor chip comprises a plurality of semiconductor chips, and
   the plurality of semiconductor chips are arranged along the first direction.

3. The semiconductor device according to claim 1, wherein the first wiring and the second wiring extend along a second direction intersecting with the first direction.

4. The semiconductor device according to claim 1, wherein a material of the at least one semiconductor chip includes wide-bandgap semiconductor.

5. The semiconductor device according to claim 1, wherein the first lead has an L shape.

6. The semiconductor device according to claim 1, wherein the at least one semiconductor chip is a transistor.

* * * * *